United States Patent
Reinhold et al.

(10) Patent No.: US 11,377,724 B2
(45) Date of Patent: Jul. 5, 2022

(54) ELECTRON BEAM EVAPORATOR, COATING APPARATUS AND COATING METHOD

(71) Applicant: VON ARDENNE Asset GmbH & Co. KG, Dresden (DE)

(72) Inventors: Ekkehart Reinhold, Dresden (DE); Joerg Faber, Mueglitztal (DE)

(73) Assignee: VON ARDENNE ASSET GMBH & CO. KG, Dresden (DE)

( * ) Notice: Subject to any disclaimer, the term of this patent is extended or adjusted under 35 U.S.C. 154(b) by 66 days.

(21) Appl. No.: 16/485,798

(22) PCT Filed: Feb. 23, 2018

(86) PCT No.: PCT/EP2018/054515
§ 371 (c)(1),
(2) Date: Aug. 14, 2019

(87) PCT Pub. No.: WO2018/154054
PCT Pub. Date: Aug. 30, 2018

(65) Prior Publication Data
US 2020/0048758 A1 Feb. 13, 2020

(30) Foreign Application Priority Data
Feb. 23, 2017 (DE) .................... 10 2017 103 746.2

(51) Int. Cl.
C23C 14/30 (2006.01)
C23C 14/54 (2006.01)
C23C 14/52 (2006.01)

(52) U.S. Cl.
CPC .............. *C23C 14/30* (2013.01); *C23C 14/52* (2013.01); *C23C 14/543* (2013.01)

(58) Field of Classification Search
CPC ...................................................... C23C 14/30
See application file for complete search history.

(56) References Cited

U.S. PATENT DOCUMENTS 3,730,962 A * 5/1973 Norwalk ............. H01J 37/3053
373/11
5,051,599 A 9/1991 Benes et al.
(Continued)

FOREIGN PATENT DOCUMENTS

CN 107437489 A 12/2017
DE 3902274 A1 8/1990
(Continued)

OTHER PUBLICATIONS

Human Translation to Iijima (JP 2004/010943) published Jan. 2004.*
(Continued)

*Primary Examiner* — John J Brayton
(74) *Attorney, Agent, or Firm* — Viering, Jentschura & Partner mbB (57) ABSTRACT

In accordance with various embodiments, an electron beam evaporator can comprise the following: a tubular target; an electron beam gun for producing at least one vapor source on a removal surface of the tubular target by means of an electron beam; wherein the removal surface is a ring-shaped axial end surface or a surface of the tubular target that extends conically or in a curved fashion from the free end edge.

20 Claims, 7 Drawing Sheets

(56) References Cited

U.S. PATENT DOCUMENTS

| | | | |
|---|---|---|---|
| 5,384,021 A | | 1/1995 | Thwaites |
| 2006/0051495 A1* | | 3/2006 | Kinder .................. C23C 14/08 427/62 |
| 2006/0151320 A1 | | 7/2006 | Weigert et al. |
| 2008/0160171 A1 | | 7/2008 | Barabash et al. |
| 2017/0345627 A1 | | 11/2017 | Mitchels et al. |

FOREIGN PATENT DOCUMENTS

| | | |
|---|---|---|
| DE | 69226322 T2 | 12/1998 |
| DE | 102013104086 B3 | 10/2014 |
| DE | 10 2013 113110 A1 | 5/2015 |
| EP | 0163445 A1 | 12/1985 |
| EP | 2075352 A1 | 7/2009 |
| EP | 2077574 A1 | 7/2009 |
| JP | H10195642 A | 7/1998 |
| JP | 2004010943 A | 1/2004 |
| JP | 2008266728 A | 11/2008 |
| JP | 2008280579 A | 11/2008 |
| JP | 2013112894 A | 6/2013 |
| KR | 20060061886 A | 6/2006 |
| KR | 20160086857 A | 7/2016 |
| WO | 2016092788 A1 | 6/2016 |

OTHER PUBLICATIONS

Notice of Refusal issued for the Korean patent application No. 10-2019-7027697, dated Apr. 22, 2021, 4 pages (for informational purposes only).

Search Report for the corresponding German Patent Application No. 10 2017 103 746.2 (8 pages) dated Oct. 12, 2017 (for reference purpose only).

International Search Report for the corresponding PCT Patent Application No. PCT/EP2018/054515 (13 pages) dated Jun. 1, 2018 (for reference purpose only).

Office Action issued for the corresponding Korean Patent Applicaiton No. 10-2019-7027697, dated Nov. 16, 2020, 5 pages (for referential purposes only).

Notice of Reasons for Rejection issued for the corresponding Japanese Patent Applicaiton No. 2019-545988 dated Nov. 2, 2020, 3 pages (for referential purposes only).

Search report by registered search organization, issued for corresponding Japanese Patent Application No. 2019-545988, dated Oct. 15, 2020, 12 pages (for informational purposes only).

Chinese Search Report issued for the corresponding Chinese patent application No. CN107437489A, dated Dec. 5, 2017, 2 pages (for informational purposes only).

* cited by examiner

ELECTRON BEAM EVAPORATOR, COATING APPARATUS AND COATING METHOD

CROSS-CITING TO RELATED APPLICATIONS

This application is a National Phase of PCT Application PCT/EP2018/054515, filed on Feb. 23, 2018, which claims priority to German Application 10 2017 103 746.2, which was filed on Feb. 23, 2017, the entirety of both of which is incorporated herein fully by reference.

TECHNICAL FIELD

Various exemplary embodiments relate to an electron beam evaporator, a coating apparatus and a coating method.

BACKGROUND

In general, various coating methods based on chemical vapor deposition or physical vapor deposition may be used for coating substrates. By way of example, it is possible to evaporate material from a so-called target by means of an electron beam, this being referred to as electron beam evaporation. By means of the electron beam, a so-called vapor source (illustratively a locally greatly heated region) may be produced on a surface of the target. Evaporated material propagates proceeding from the vapor source, that is to say that the evaporated material is illustratively emitted by the vapor source. The emitted material may condense on a substrate, for example, with the result that a layer is formed on the substrate.

Electron beam evaporation may be carried out in various modifications. Usually, the material of the target (referred to as target material) is melted by means of the electron beam and is therefore provided in a crucible. The substrate to be coated may for example be guided above the crucible, e.g. in a freely suspended fashion or lying in a substrate carrier, and be coated illustratively from below. By way of example, a so-called electron beam gun may be used for providing the electron beam. The electron beam gun includes an electron beam source for generating the electron beam and a deflection apparatus for statically or dynamically deflecting the electron beam in a desired direction. By means of the deflection apparatus, so-called electron beam figures (or illustratively patterns) may be produced (in other words written) on the surface of the target to be evaporated by means of the electron beam being guided in accordance with the desired electron beam figures along a predefined path. By way of example, a vapor source having a desired shape or having a desired pattern may thus be produced. Moreover, by way of example, a plurality of vapor sources may be produced next to one another on a surface of the target. Furthermore, it is also possible to produce one respective vapor source on a plurality of targets (e.g. arranged next to one another) by means of only one electron beam. The deflection of the electron beam, which may be carried out by means of an electric and/or magnetic field, for example, is referred to as beam guiding, for example.

In the case of some coating configurations, it may be necessary or helpful to shoot the electron beam into a region between a substrate and the target, which may be carried out at different angles with respect to the normal, for example substantially horizontally, depending on the coating geometry. In this case, the electron beam may be deflected onto the target surface by means of a correspondingly configured magnetic field. In general, the magnetic field may be provided in such a way that the electron beam impinges on the target surface as steeply as possible (e.g. substantially at right angles). The elements for generating such an external magnetic field are generally referred to as a deflection system.

SUMMARY

In accordance with various embodiments, an electron beam evaporator is provided which makes it possible to evaporate target material (in particular sublimating target material and/or target material having a high melting point) by means of an electron beam in an efficient manner. Furthermore, it becomes possible to carry out the evaporation process with long-term stability without interruption. It also becomes possible for the substrates that are to be coated to be subjected only to low thermal loading by means of the electron beam evaporator described herein.

In accordance with various embodiments, an electron beam evaporator may include the following, for example: a tubular target; an electron beam source and a beam guide (i.e. an electron beam gun) for producing at least one vapor source on a removal surface of the tubular target by means of an electron beam; wherein the removal surface is a ring-shaped axial end surface or a surface of the tubular target that extends conically or in a curved fashion (e.g. concavely or convexly) from the free end edge.

Illustratively, the removal surface is configured in such a way that a dimensional stability of the removal surface is established after a limited process set-up time.

In accordance with various embodiments, the expected shape of the removal surface which is established after a limited process set-up time (illustratively the removal contour being established) may be determined in advance (e.g. calculated or determined empirically). Accordingly, an evaporation material target may be provided which has already before the beginning of the process an initial contour substantially corresponding to the removal contour being established (i.e. already comes as close as possible to the removal contour being established). As a result, for example, it is possible to save process set-up time in favor of a more rapidly stable coating process.

In accordance with various embodiments, a coating apparatus may include the following: a coating chamber having at least one coating region; at least one electron beam evaporator, as described herein, for coating a substrate in the coating region.

In accordance with various embodiments, a coating method may include the following: producing a vapor source on a removal surface of a tubular target by means of an electron beam, wherein the removal surface is a ring-shaped axial end surface or a surface of the tubular target that extends conically or in a curved fashion from the free end edge and that, if appropriate, is also curved; and coating a substrate by means of vapor emitted by the vapor source.

In accordance with various embodiments, an electron beam evaporator arrangement may be provided which includes a plurality of electron beam evaporators or which includes for example a plurality of tubular targets.

In accordance with various embodiments, a ring-shaped surface may be understood as a surface extending circumferentially in a closed fashion, e.g. extending circumferentially along a circular path. In accordance with various embodiments, a ring-shaped surface may be understood as a surface extending circumferentially in a closed fashion with a radial curvature or curve that is constant in the course of the circumferential revolution.

Exemplary embodiments are illustrated in the figures and are explained in greater detail below.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiment. In the following description, various embodiments are described with reference to the following drawings, in which.

DETAILED DESCRIPTION

In the following detailed description, reference is made to the accompanying drawings, which form part of this description and show for illustration purposes specific embodiments in which the disclosure may be implemented. In this regard, direction terminology such as, for instance, "at the top", "at the bottom", "at the front", "at the back", "front", "rear", etc. is used with respect to the orientation of the figure(s) described. Since components of embodiments may be positioned in a number of different orientations, the direction terminology serves for illustration and is not restrictive in any way whatsoever. It goes without saying that other embodiments may be used and structural or logical changes may be made, without departing from the scope of protection of the present disclosure. It goes without saying that the features of the various exemplary embodiments described herein may be combined with one another, unless specifically indicated otherwise. Therefore, the following detailed description should not be interpreted in a restrictive sense, and the scope of protection of the present disclosure is defined by the appended claims.

In the context of this description, the terms "connected", "attached" and "coupled" are used to describe both a direct and an indirect connection, a direct or indirect attachment, and a direct or indirect coupling. In the figures, identical or similar elements are provided with identical reference signs, in so far as this is expedient.

In accordance with various embodiments, the electron beam evaporator described herein may be used for large-area coating by means of electron beam evaporation, e.g. for producing a fuel cell, a battery, or very generally for producing carbon layers (e.g. graphite-like and/or diamond-like layers) or ceramic layers on a substrate.

Electron beam evaporation belongs to the family of the coating processes of physical vapor deposition (PVD) and is also referred to as EB-PVD (electron beam physical vapor deposition). In this method, it is conventional practice to evaporate the evaporation materials, if possible (e.g. in the case of metals), from corresponding supply crucibles. In general, substrates in strip form are moved across the vapor sources produced by the electron beam or substrates carried in substrate carriers are moved across the vapor sources produced by the electron beam and are coated in this way. The vapor sources may be positioned in such a way (i.e. at a corresponding distance from one another and a corresponding distance from the substrate plane) that a sufficient layer thickness homogeneity and the highest possible vapor utilization may be achieved. Furthermore, on the application side, it may be taken into consideration that the coating process may be kept stable over long periods of time.

In the case of sublimating materials, the containers to be filled with the evaporation material, which are generally referred to as crucibles, may be dispensed with, if appropriate. In such a case, the evaporation material is kept at the evaporation location/process location by means of a support (i.e. a correspondingly configured support arrangement).

It may be difficult for example to achieve the long-term stability of the evaporation processes of sublimating materials because the evaporation material does not melt and hence the material removal is not levelled on the basis of the melting phase that conventionally occurs (e.g. in the case of many metals). It is conventional practice for various arrangements to be used, the aim of which is approximately fixed source positioning despite the material removal on account of the evaporation. By way of example, conventional crucible systems or evaporation material support systems may be constructed in such a way that uniform material tracking in the plane for feeding the vapor source may be carried out by means of a two-dimensional movement. The system movement here may be geared to achieving a meandering or else spiral feed of the evaporation material. What may be disadvantageous for this solution, for example, is that for supplying the evaporation material large surface areas are required in order that the vapor deposition distance, which increases on account of the evaporation (or the material removal) during the evaporation process, is kept virtually constant for as long as possible. Changes in the vapor deposition distance may alter the layer thickness distribution on the substrate, for example, which ought to be avoided as much as possible during a coating campaign. On the other hand, the heating of the large surface area of such evaporator systems conventionally used results in considerable thermal radiation loadings of the process chamber and of the substrate to be coated. This applies in particular to materials having a high evaporation temperature.

Furthermore, an electron beam evaporator may also be configured as a rod evaporator, wherein the vapor source may be positioned on a surface region of the rod tip facing the substrate to be coated. The rod may carry out a rotational movement and a translational feed movement, for example, with the result that an unchanged source position may be attained. The hot emissive surface of the rod is significantly smaller than in the case of a two-dimensionally horizontally moved system. The small supply quantity (defined by the rod volume) may be disadvantageous, however, since the length of the rod, for example, has to be limited for apparatus engineering reasons. Frequent rod changes result in undesired process interruptions, however. Transitions of coupled rod sequences may result in undesired fluctuations in the evaporation rate, for example. Moreover, keeping constant the evaporating surface at the rod tip may be difficult and require for example electron beam figures having a very complex design.

The construction of the electron beam source described herein may take into account for example at least one of the following:

- the positions of the vapor sources are adaptable to an optimum source location;
- the positions of the vapor sources may be kept constant over long periods of time (e.g. more than one day or more than one week) of the process implementation;
- the process implementation is manageable as simply as possible (e.g. with regard to the evaporation process and the material tracking);
- the evaporation process may be implementable with long-term stability (e.g. longer than one day or longer than one week) without interruption, which places demands for example on a correspondingly extensive supply and tracking of the evaporation material (also referred to as target material);
- the evaporation material is provided in a simply producible form; and/or
- the thermal substrate loading on account of the emission proceeding from the evaporation material is as small as possible.

Figure 1:
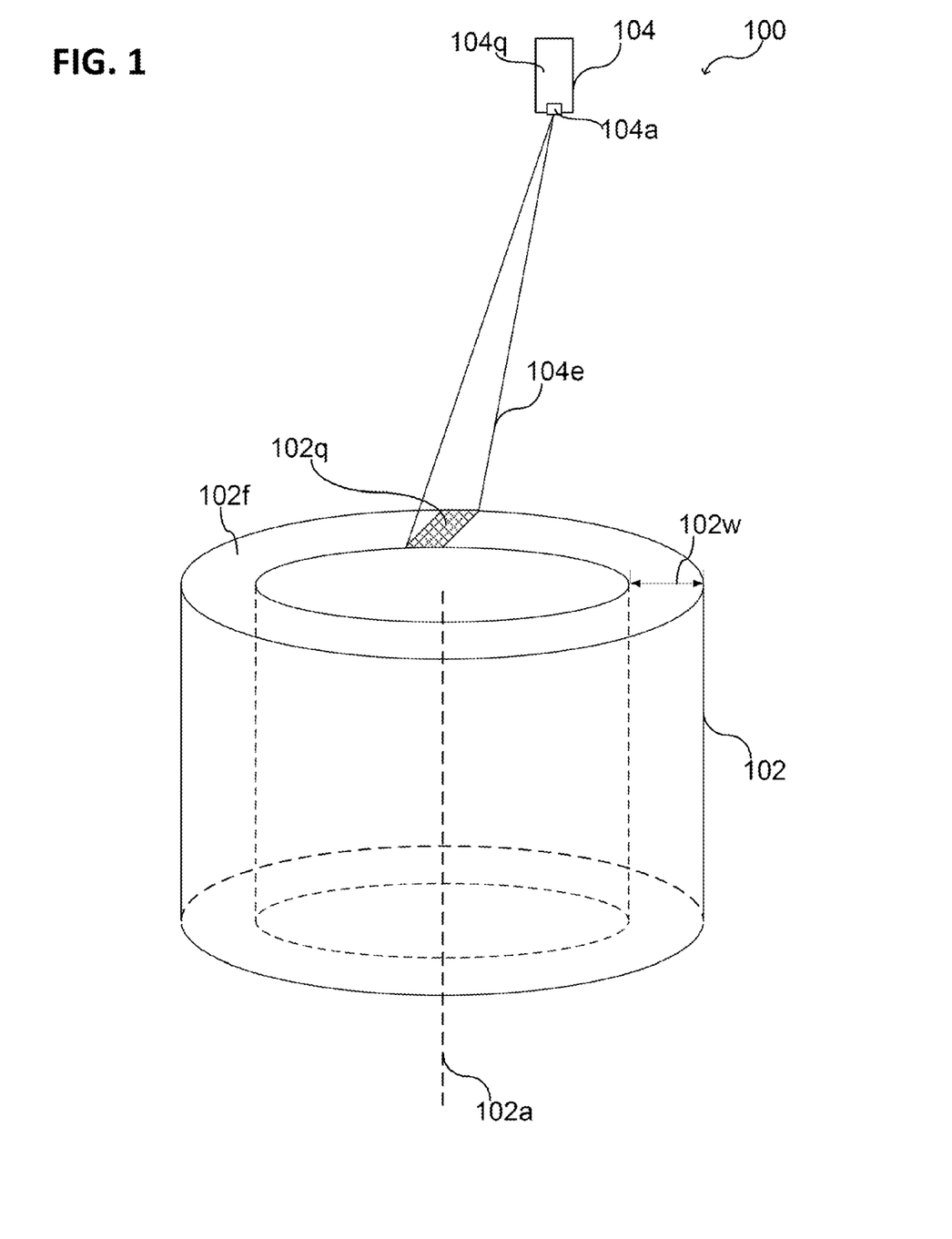
FIG. 1 shows an electron beam evaporator in a schematic illustration, in accordance with various embodiments.

FIG. 1 illustrates an electron beam evaporator 100 (also referred to as electron beam evaporation apparatus) in a schematic perspective view, in accordance with various embodiments.

The electron beam evaporator 100 may include at least one tubular target 102, for example. The evaporation material is provided by means of the at least one tubular target 102. Furthermore, the electron beam evaporator 100 includes at least one electron beam gun 104. The electron beam gun 104 is configured for producing at least one vapor source 102$q$ on a removal surface 102$f$ of the tubular target 102 by means of an electron beam 104$e$. The electron beam gun 104 may include an electron beam source 104$q$ and a deflection system 104$a$ for deflecting the electron beam 104$e$ produced by means of the electron beam source 104$q$.

The deflection of the electron beam 104$e$ in a plane perpendicular to the main emission direction may be referred to as X-Y-deflection. The main emission direction may be predefined by the electron beam source 104$q$, for example. Such an X-Y-deflection may be carried out for example by means of a plurality of coils (e.g. two, four or six), wherein the plurality of coils are arranged in the plane perpendicular to the main emission direction in such a way that the main emission direction extends through between the coils. In contrast thereto, an electron beam 104$e$ may be focused by means of an electromagnetic lens (magnetic lens), wherein in this case a coil may be arranged in such a way that the electron beam 104$e$ propagates through the coil and in so doing may be focused by means of the coil. The magnetic focusing may be used even with high beam powers.

Furthermore, the electron beam evaporator 100 or the electron beam evaporator arrangement may include further elements for guiding the electron beam in the direction of the process location (not illustrated), e.g. deflection magnetic fields or the like, for producing the at least one vapor source 102$q$ on the removal surface 102$f$ of the tubular target 102.

As is illustrated in FIG. 1, the removal surface 102$f$ may be a ring-shaped axial end surface of the tubular target 102. In other words, the removal surface 102$f$ may be a surface that is exposed in the axial direction at the axial end section of the tubular target 102. As an alternative thereto, the removal surface 102$f$ of the tubular target 102 may be a surface of the tubular target 102 that extends conically or in a curved fashion from the free end edge (e.g. the removal surface may be curved in a radial direction), as is illustrated in FIG. 2B, for example.

In accordance with various embodiments, the evaporation material fed to the process is provided as at least one tube (e.g. as a graphite tube for producing a carbon layer), on the end side of which at least one small-area vapor source is produced, e.g. in a fixed manner, by means of an electron beam 104$e$. The small-area vapor source may have for example a surface area that is substantially adapted to the wall thickness 102$w$ of the tube. In accordance with various embodiments, the surface area of the vapor source 102$q$ may be less than 50 cm$^2$, e.g. less than 40 cm$^2$, less than 30 cm$^2$, less than 20 cm$^2$ or less than 10 cm$^2$. The smaller the surface area of the vapor source 102$q$, the better the latter may be for evaporating sublimating materials, wherein a minimum size should not be undershot, e.g. if only for efficiency reasons; by way of example, the surface area of the vapor source 102$q$ may be greater than 1 cm$^2$.

Figure 2A:
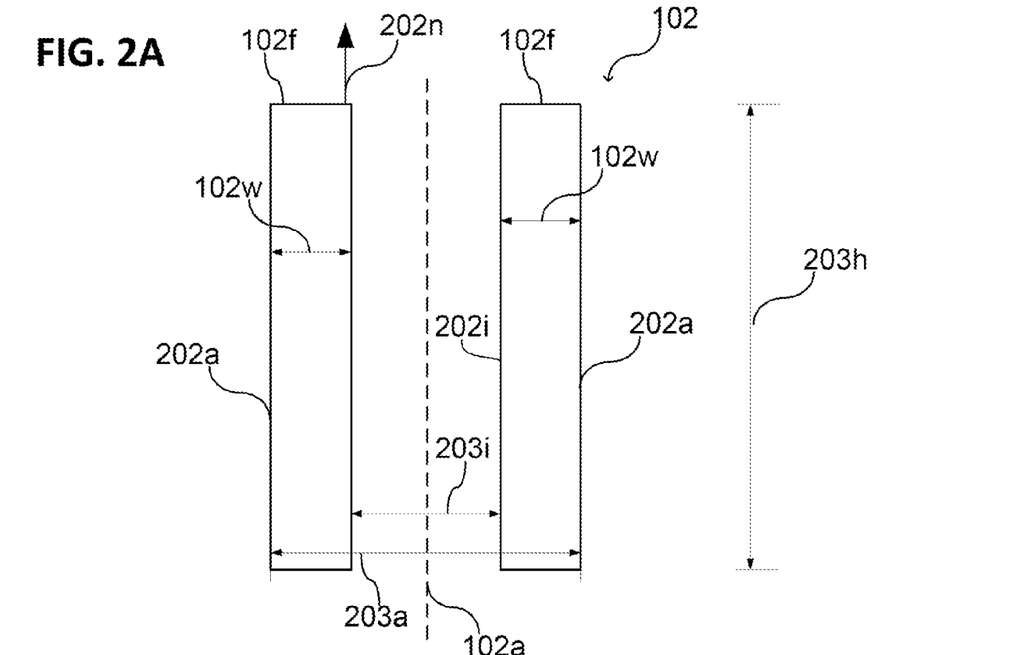
FIGS. 2A to 2C each show a tubular target in a schematic cross-sectional view, in accordance with various embodiments.
Figure 2B:
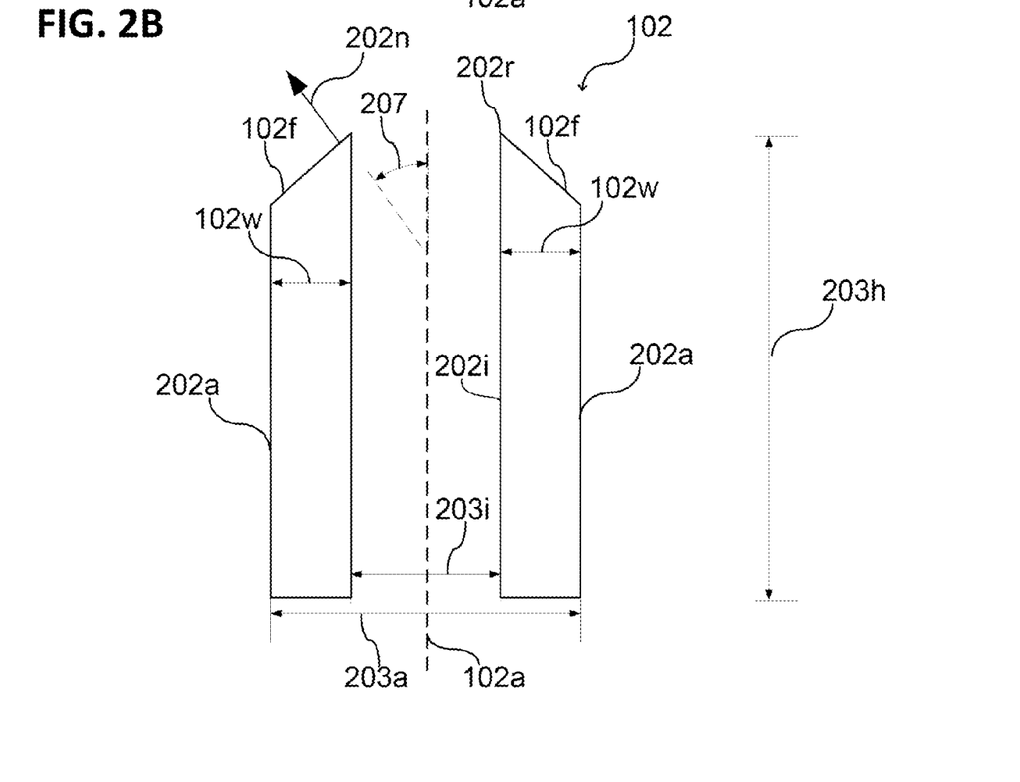
Figure 2C:
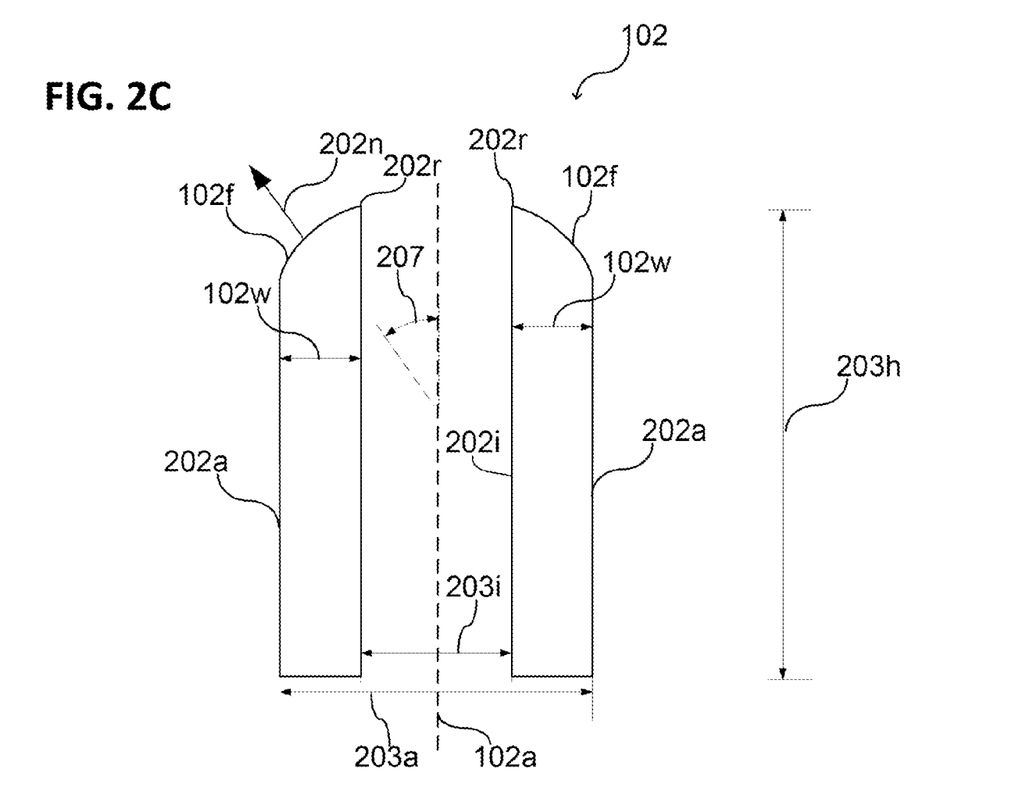

FIG. 2A, FIG. 2B and FIG. 2C illustrate in each case by way of example various tubular targets 102 in a sectional view through the axial plane (in a plane parallel to the tube axis 102$a$ of the tubular target 102).

In accordance with various embodiments, the tubular target 102 may substantially have the shape of a hollow cylinder. In other words, the tubular target 102 may have an internal cylindrical lateral surface 202$i$ having an internal diameter 203$i$ and also an external cylindrical lateral surface 202$a$ having an external diameter 203$a$. The difference in radius corresponds to the wall thickness 102$w$ of the tubular target 102.

As is illustrated in FIG. 2A, an end surface of the cylindrical tubular target 102 may be used as a removal surface 102$f$, on which at least one vapor source 102$q$ is formed by means of the electron beam 104$e$ (i.e. from which the target material of the tubular target 102 is removed). In other words, the removal surface 102$f$ may be a ring-shaped end surface that extends substantially perpendicularly to the tube axis 102$a$ of the tubular target 102. In this case, the surface normal 202$n$ of the removal surface 102$f$ lies substantially parallel to the tube axis 102$a$ of the tubular target 102. The shape of the tubular target 102 on an opposite side of the tubular target 102 relative to the removal surface 102$f$ may be configured in any desired fashion.

As is illustrated in FIG. 2B, the tubular target 102 may illustratively be pointed or have a chamfer at the end-side end. In other words, a surface of the tubular target 102 that extends conically from the free end edge 202$r$ may be used as a removal surface 102$f$. As is illustrated in FIG. 2C, the tubular target 102 may illustratively be rounded or have a rounding or curve at the end-side end. In other words, a surface of the tubular target 102 that extends in a curved fashion from the free end edge 202$r$ may be used as a removal surface 102$f$. In this case, the removal surface 102$f$ may extend from the internal cylindrical lateral surface 202$i$ (or the internal circumferential wall) to the external cylindrical lateral surface 202$a$ (or to the external circumferential wall). As an alternative thereto, the removal surface 102$f$ may extend from an outer end edge having a diameter greater than the internal diameter 203$i$ as far as the external cylindrical lateral surface 202$a$. Furthermore, the outer end edge may have a diameter that is less than the external diameter 203$i$. In other words, the removal surface 102$f$ may be a ring-shaped surface whose surface normals 202$n$ are oriented at an angle 207 with respect to the tube axis 102$a$ of the tubular target 102. The shape of the tubular target 102 on an opposite side of the tubular target 102 with respect to the removal surface 102f may be configured in any desired fashion.

Illustratively, in both examples illustrated, the removal surface 102f is not the outer lateral surface of the tubular target 102, whose surface normal 202n is oriented perpendicular to the tube axis 102a, but rather an exposed surface of the tubular target 102 whose surface normal 202n is oriented at an angle 207 of less than 90° with respect to the tube axis 102a, e.g. at an angle 207 of less than 75°, e.g. at an angle 207 of 0° to 75°, or at an angle 207 of 0° to 50°.

In accordance with various embodiments, the tubular target 102 may be shaped substantially rotationally symmetrically with respect to the tube axis 102a thereof. The at least one vapor source 102q produced on the removal surface 102f may thus remain positionally fixed when the tubular target 102 is rotated about the tube axis 102a thereof.

In accordance with various embodiments, the tubular target 102 may have a wall thickness 102w in a range of approximately 0.1 cm to approximately 10 cm, preferably in a range of approximately 1 cm to approximately 6 cm. As an alternative thereto, the wall thickness 102w may also be greater than approximately 10 cm.

In accordance with various embodiments, the tubular target 102 may have an internal diameter 203i of greater than approximately 2 cm, e.g. greater than approximately 5 cm or greater than approximately 10 cm. In this case, the internal diameter 203i of the tubular target 102 may be chosen with a magnitude such as is allowed by the structural space in a processing chamber taking account of the length 203h of the tubular target 102 and the wall thickness 102w or such as proves to be advantageous. By way of example, the internal diameter 203i of the tubular target 102 may be up to a number of meters, depending on the prevailing limit dimensions regarding the producibility of the tubular target.

In accordance with various embodiments, the tubular target 102 may have a length 203h of greater than 10 cm. In this case, the length 203h of the tubular target 102 may be chosen with a magnitude such as is allowed by the structural space in a processing chamber taking account of the internal diameter 203i and the wall thickness 102w of the tubular target 102 or such as proves to be advantageous. By way of example, the length 203h of the tubular target 102 may be up to a number of meters.

On the other hand, it is possible to provide the dimensions of the tubular target 102 regarding length and/or diameter such that, given a predefined quantity of material, it is possible to use a coating chamber having the smallest possible structural space. The wall thickness of the tubular target 102, by contrast, e.g. in a material-dependent manner, may not be increased arbitrarily since the thickness of the wall material to be removed corresponds for example to an expedient extent of the removing electron beam source surface. The removing electron beam source surface in turn is determined by the required power density input for generating the source temperature required for a desired evaporation rate.

In accordance with various embodiments, the tubular target 102 may include or consist of carbon or some other sublimating material, provided that tubular targets are producible therefrom. Besides carbon, the elements boron, chromium, magnesium, arsenic, tellurium, iodine and some sulfides, fluorides, tellurides, carbides, borides or oxides are also suitable.

Figure 3:
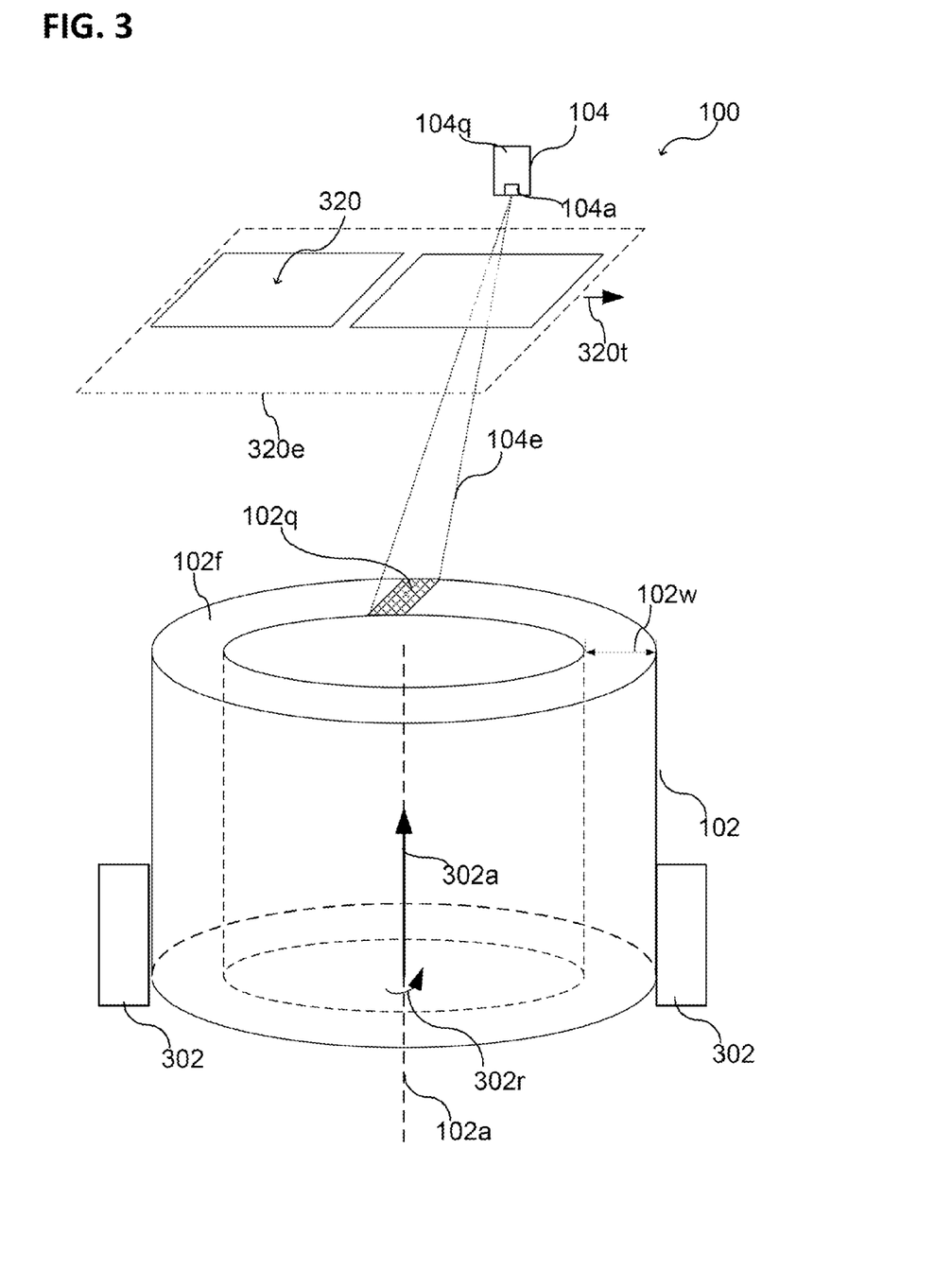
FIG. 3 shows an electron beam evaporator in a schematic illustration, in accordance with various embodiments.

FIG. 3 illustrates an electron beam evaporator 100 in a schematic perspective view, in accordance with various embodiments. The tubular target 102 may be mounted rotatably by means of a support arrangement 302, for example. The tubular target 102 may thus be rotated 302r about its tube axis 102a (e.g. by means of a suitable drive). This makes it possible, for example, for material to be removed uniformly from the removal surface 102f. Furthermore, the tubular target 102 may be mounted in such a way that the tubular target 102 may be moved 302a in an axial direction (e.g. by means of a suitable drive). This makes it possible, for example, to track the removal surface 102f in such a way that the at least one vapor source 102q may remain positionally fixed. Consequently, by way of example, a distance between the removal surface 102f and a substrate 320 to be coated, or a substrate plane 320e, in which the substrate 320 to be coated in each case is guided along a transport direction 320t, may be kept substantially constant (e.g. with a deviation of less than a few centimeters, e.g. less than 5 mm or less than 1 mm). A constancy of the positional height of the source with a maximum deviation of, for example, 1 mm or less may be achieved by means of the feed movement.

Illustratively, the tubular target 102 and the electron beam gun 104 and also the substrate transport are correspondingly configured to move the substrate 320 in a suitable manner through the stream of vapor produced.

Figure 4:
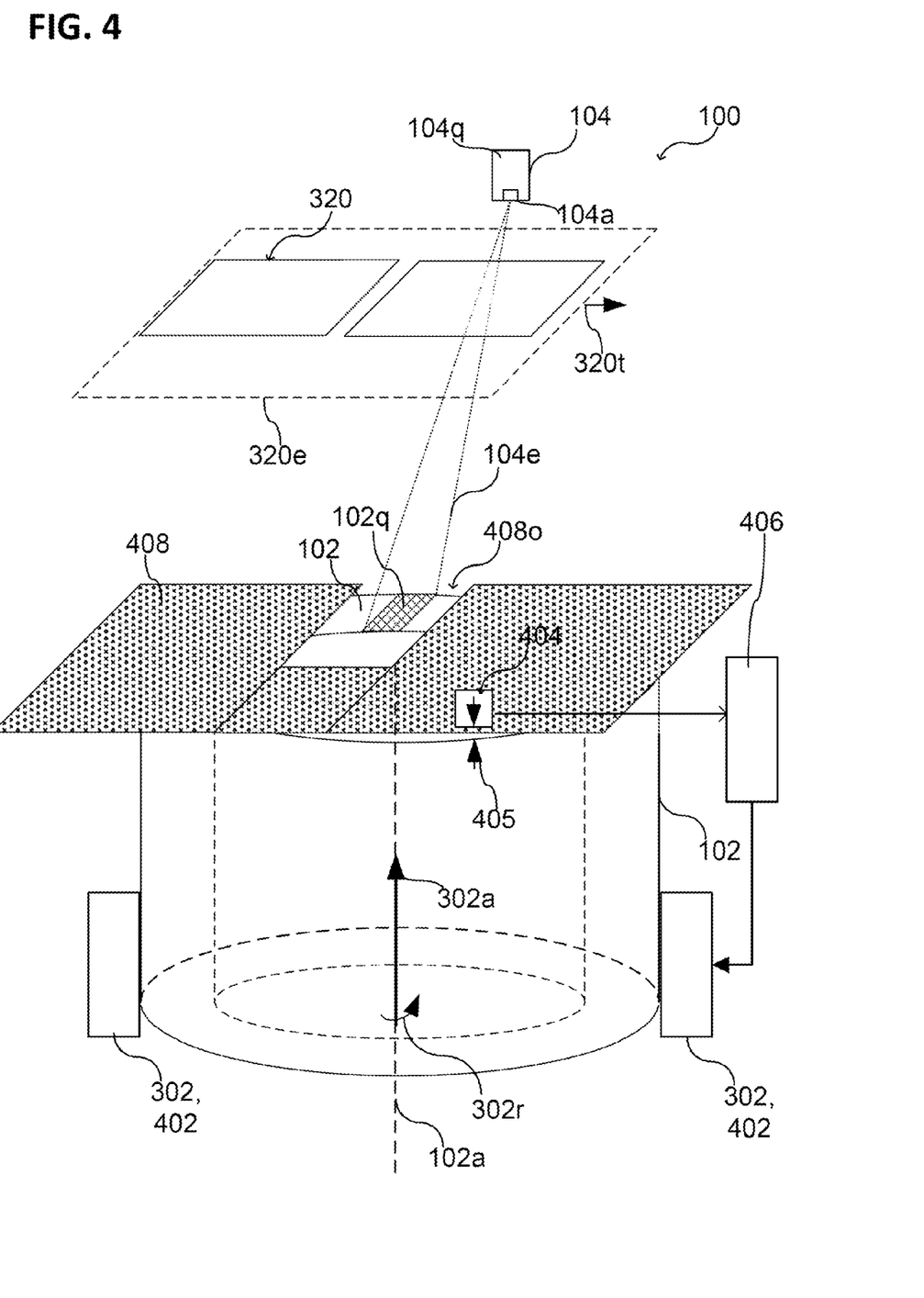
FIG. 4 shows an electron beam evaporator in a schematic illustration, in accordance with various embodiments.

FIG. 4 illustrates an electron beam evaporator 100 in a schematic perspective view, in accordance with various embodiments.

By way of example, at least one sensor 404 configured to detect sensor data may be provided. The sensor data may represent for example a spatial position of the removal surface 102f. The sensor 404 may be for example an optical distance sensor, e.g. based on the use of a laser for distance measurement. As an alternative thereto, any other suitable sensor 404 may be used.

Furthermore, an actuating apparatus 402 may be provided, which is configured for moving 302a the tubular target 102 in an axial direction. The actuating apparatus 402 may be a linear actuating apparatus, for example, which makes it possible to feed the tubular target 102 in the direction of the substrate plane 320e.

The substrate plane 320e (also referred to as transport plane) may be defined for example by the transport apparatus respectively used, which is configured to move the substrates 320 relative to the at least one vapor source 102q along a transport direction 320t.

By means of a regulator 406, the spatial position of the removal surface 102f (for example the relative distance with respect to a reference object, e.g. the substrate plane 320e) may be kept constant for example on the basis of the sensor data determined by the sensor 404, by means of the actuating apparatus 402.

In accordance with various embodiments, the electron beam evaporator 100 may include a diaphragm arrangement 408. The diaphragm arrangement 408 may be configured in such a way that it partly covers the removal surface 102f. The diaphragm arrangement 408 includes for example at least one diaphragm opening 408o such that the electron beam 104e may be guided through the diaphragm opening 408o onto the removal surface 102f of the tubular target 102, in order to produce the at least one vapor source 102q.

In accordance with various embodiments, the sensor 404 may be configured to detect a distance between the removal surface 102f and the diaphragm arrangement 408, or in other words the reference object of the regulator 406 may be the diaphragm arrangement 408 or a part of the diaphragm arrangement 408. Furthermore, the sensor 404 may be mounted on the diaphragm arrangement 408.

In accordance with various embodiments, the diaphragm arrangement 408 may include a cooling structure for cooling the diaphragm arrangement 408. For this purpose, by way of example, at least one cooling channel may be provided (not illustrated) in and/or at the diaphragm arrangement 408. By way of example, liquid cooling (e.g. water cooling) may be used.

As set out above, the tube may be rotated 302r about its axis of symmetry (or tube axis 102a) during the evaporation of the sublimating evaporation material and the material removal from the end side of the tube, such that new evaporation material is fed to the evaporation spot or the source region. At the same time the tubular target 102 may be moved parallel to its axis of symmetry with a translational movement 302a in the direction of the source position in order that the vapor deposition distance which otherwise changes as a result of the evaporation, is kept substantially constant.

The rotational movement 302r and the translational movement 302a may be produced independently of one another. As an alternative thereto, the rotational movement 302r and the translational movement 302a may be carried out in a coupled manner, e.g. as helical movement by means of only one drive.

The speed of the feed movement or the feed movements is adapted to the removal corresponding to the evaporation rate.

A cooled shield (also referred to as diaphragm arrangement 408) may be arranged above the end side of the tubular target 102 on which the electron beam 104e impinges. Said shield may have the following functions, for example:
1. the partial shielding of hot regions of the tubular target 102 vis-à-vis the substrate 320, wherein the evaporating source regions 102q are exposed,
2. carrying at least one distance sensor 404 for detecting the distance between the tubular target 102 and the shield in order, during the tracking 302a of the evaporation material by means of corresponding speed adaptation and/or power adaptation, to maintain a positional constancy of the at least one vapor source 102q (in the simplest case the height constancy) within acceptable limits.

If the tubular target 102 has a conical removal surface 102f, as is illustrated in FIG. 2B, for example, the diaphragm arrangement 408 may be adapted corresponding to the shape, and may for example likewise have a conical shape matching the tubular target 102.

In accordance with various embodiments, a removal device may be positioned at the diaphragm arrangement 408 and/or below the diaphragm arrangement 408, said removal device being configured to remove (e.g. mechanically) non-evaporated residues of evaporation material on the end side of the tubular target 102 and thus to level the end side.

In accordance with various embodiments the external diameter 203a of the tubular target 102 may be chosen with a magnitude such that it is also possible to produce two or more than two vapor sources 102q on the removal surface 102f (e.g. along a circumferential direction) by means of the electron beam 104e. In accordance with various embodiments, the source positions of the vapor sources 102q may be chosen such that it is possible to produce a coating on the substrate 320 with a predefined layer thickness homogeneity.

In accordance with various embodiments, a large tube diameter 203a (e.g. greater than 0.5 m or greater than 1 m) may be used, which allows a correspondingly large mass supply of target material to be provided. By way of example, a long-term evaporation process may thus be provided. By way of example, graphite tubes may be used as tubular targets 102, which may be available up to a diameter 203a of 1200 mm in the standard product range of graphite semifinished product manufacturers. Given a correspondingly large tube diameter 203a, the length 203h of the tubular target 102 may be kept small, e.g. less than 0.5 mm. This affords possibilities for optimizing the evaporator geometry with regard to minimizing the process chamber volume.

Optionally, it is possible to combine two or more tubular evaporators in a vapor deposition configuration. In this case, the number of tubular targets 102, vapor sources 102q, electron beam guns 104 used and beam guidance may be adapted accordingly. Given symmetrical integral arrangements of tubular targets 102, the tubular targets 102 arranged mirror-symmetrically with respect to the axis of symmetry of the substrate flow may advantageously carry out a rotation 503r in the opposite direction, as is illustrated for example in FIG. 5 in a schematic view.

Figure 5:
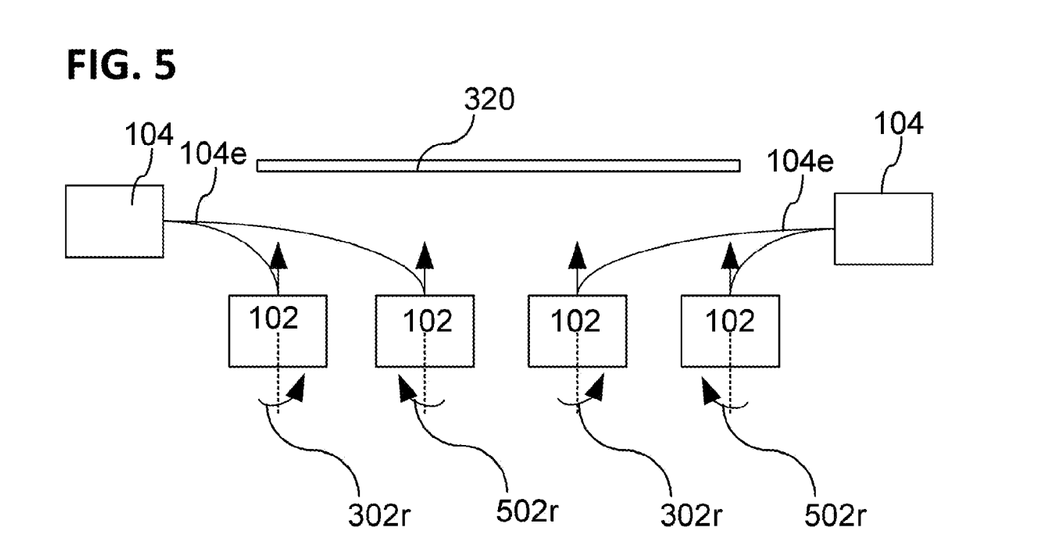
FIG. 5 shows an electron beam evaporator arrangement in a schematic illustration, in accordance with various embodiments.

In the case of the vapor deposition configuration illustrated in FIG. 5, the substrate transport direction 320t may be perpendicular to the plane of the drawing. The respective substrate 320 may thus be coated for example over its entire width.

As a result, it is possible to achieve for example a positional constancy of the vapor source 102q or vapor sources 102q relative to the substrate 320. A simple process set-up and stabilization of the removal geometry and of the thermal process conditions furthermore result. A simple monitoring and control possibility for the material feed furthermore results. A large evaporation material volume or a sufficient supply for long campaigns without process interruption for a material change furthermore results. It is thus possible to minimize rate dips on account of a material change. A flexibility regarding the arrangement and optimization in the available process space and regarding the width of the substrate flow furthermore results.

Furthermore, by means of the construction of the electron beam evaporator 100 as described herein, it is possible to smooth the end side (i.e. the removal surface 102f) of the tubular target 102 with the aid of a removal device (e.g. mechanically).

Figure 6:
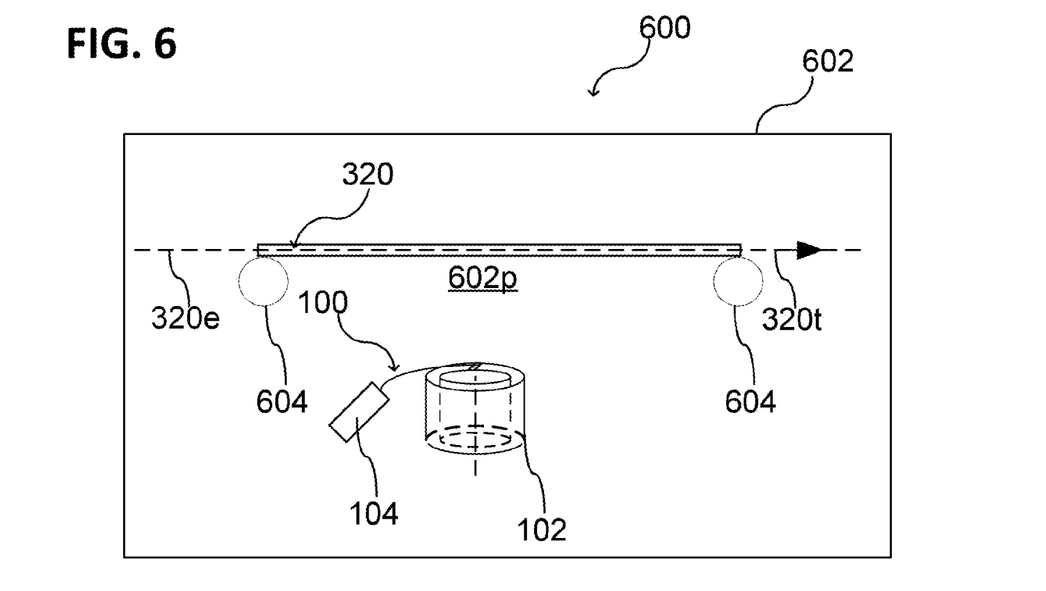
FIG. 6 shows a coating apparatus in a schematic illustration, in accordance with various embodiments.

FIG. 6 illustrates a coating apparatus 600 comprising an electron beam evaporator 100 in a schematic illustration, in accordance with various embodiments.

The coating apparatus 600 may include the following, for example: at least one coating chamber 602 having at least one coating region 602p; and at least one electron beam evaporator 100 for coating a substrate 320 in the coating region 602p. The coating chamber 602 may be for example a vacuum chamber, wherein a pressure of less than 1 mbar, for example, may be provided in the coating region 602p, e.g. a pressure in a range of approximately $10^{-6}$ mbar to 1 mbar.

Furthermore, the coating apparatus 600 may include a transport apparatus 604 for transporting the substrate 320 in the coating region 602p along a transport direction 320t.

The transport apparatus 604 may be adapted to the substrates 320 to be transported in each case. Stiff substrates or substrate carriers may be transported for example in a manner bearing on an arrangement of transport rolls. Flexible substrates (e.g. films or strips) may be transported by means of a take-up and take-off roll, and optionally one or more deflection rolls (from roll to roll). Furthermore, any other suitable apparatus may be used for transporting and/or positioning the substrates 320 in the coating region 602p.

As is also illustrated in FIG. 5, for example, a plurality of electron beam evaporators 100 or a plurality of tubular targets 102 may be provided in a coating chamber 602. By way of example, a plurality of tubular targets 102 may be arranged in a series along a direction at an angle (e.g. transversely) with respect to the transport direction 320t. In a similar manner, a plurality of tubular targets 102 of an electron beam evaporator 100 may be arranged in a series along a direction at an angle (e.g. transversely) with respect to the transport direction 320t. Here in each case two adjacent tubular targets 102 of one or more electron beam evaporators 100 may be configured such that they rotate in opposite rotation directions 302r, 502r. As an alternative thereto, it is also possible for all the tubular targets 102 to rotate in the same rotation direction.

Figure 7:
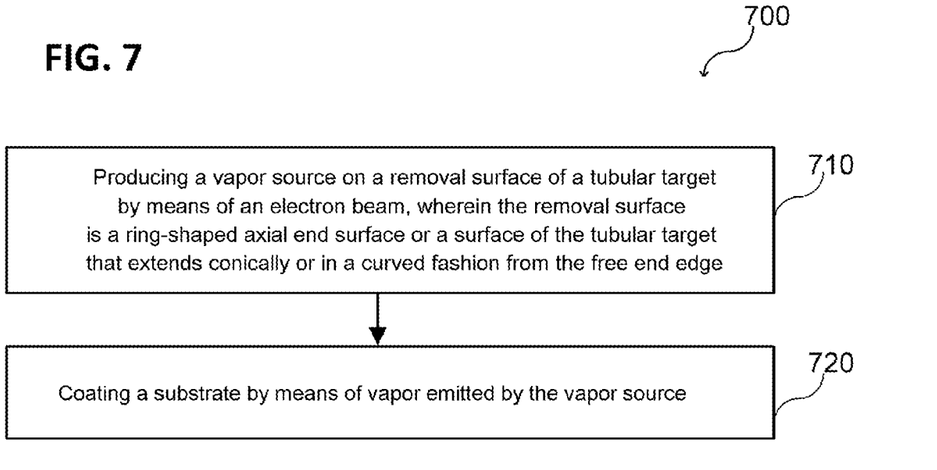
FIG. 7 shows a schematic flow diagram of a coating method, in accordance with various embodiments.

FIG. 7 illustrates a schematic flow diagram of a coating method 700, in accordance with various embodiments. The coating method 700 may include the following, for example: in 710, producing at least one vapor source 102q on a removal surface 102f of a tubular target 102 by means of an electron beam 104e, wherein the removal surface 102f is a ring-shaped axial end surface or a surface of the tubular target 102 that extends conically or in a curved fashion from the free end edge; and, in 720, coating a substrate 320 by means of vapor emitted by the vapor source 102q.

In accordance with various embodiments, the method may furthermore include rotating the tubular target 102 about the tube axis 102a thereof and moving the tubular target 102 in the direction of the substrate 320 to be coated or the substrate plane 320e in order to compensate for the material removal from the removal surface 102f.

In accordance with various embodiments, an electron beam evaporator 100 is provided which is configured such that a vapor source 102q is provided on a tracked, rotating tube.

On account of the cavity in the tubular target 102, it is possible to prevent the latter from being heated over a large area, as would be the case for a solid target (e.g. a rod). On account of the geometry of the tubular target 102, the thermal propagation by means of heat conduction from the region of the vapor source 102q is limited.

In accordance with various embodiments, the tubular target 102 may be used in a manner standing vertically in a coating apparatus 600. As an alternative thereto, the tubular target 102 may be arranged in a manner tilted relative to the vertical direction in a coating apparatus 600.

In accordance with various embodiments, an electron beam figure produced by means of the electron beam on the removal surface 102f may be produced in a positionally fixed manner, wherein the tubular target 102 is rotated, such that the removal surface 102f moves through below the electron beam figure.

In accordance with various embodiments, the tubular target 102 may be mounted (e.g. clamped) in such a way that a wobble movement is avoided.

In accordance with various embodiments, it is also possible, if necessary, to arrange two tubular targets 102 or more than two tubular targets 102 in a manner fitted coaxially one in another, wherein a gap remains in each case between the adjacent tubular targets 102. In this case, the respective removal surfaces 102f may be substantially coplanar, i.e. lie in a common plane.

In accordance with various embodiments, it is also possible, if necessary, to arrange two tubular targets 102 or more than two tubular targets 102 coaxially next to one another, wherein a gap remains in each case between the adjacent tubular targets 102. In this case, the respective removal surfaces 102f may be substantially coplanar, i.e. lie in a common plane.

In accordance with various embodiments, the tubular target 102 may be mounted in such a way that it may be moved translationally along the x-, y- and z-directions and may furthermore be rotated about at least one axis (e.g. the tube axis 102a).

A description is given below of various examples relating to what has been described above.

Example 1 is an electron beam evaporator 100, comprising: a tubular target 102; an electron beam source 104q and a beam guide for producing a vapor source 102q on a removal surface 102f of the tubular target 102 by means of an electron beam 104e; wherein the removal surface 102f is a ring-shaped axial end surface or a surface of the tubular target 102 that extends conically or in a curved fashion from the free end edge. In a similar manner, an electron beam evaporator 100 may include the following: a tubular target 102; an electron beam gun 104 for producing at least one vapor source 102q on a removal surface 102f of the tubular target 102 by means of an electron beam 104e; wherein the removal surface 102f is a ring-shaped axial end surface or a surface of the tubular target 102 that extends conically or in a curved fashion from the free end edge. Illustratively, the removal surface 102f may be provided such that it does not correspond to the external lateral surface of the tubular target 102.

In example 2, the electron beam evaporator 100 in accordance with example 1 may optionally include the fact that the angle 207 between the tube axis 102a and a surface normal 202n of the removal surface 102f is in a range of 0° to 75°.

In example 3, the electron beam evaporator 100 in accordance with example 1 or 2 may optionally include the fact that the tubular target 102 has a wall thickness 102w in a range of approximately 0.5 cm to approximately 10 cm. By way of example, the wall thickness 102w of the tubular target 102 may be in a range of approximately 1 cm to approximately 6 cm. This makes possible for example an efficient evaporation or sublimation of carbon or graphite.

In example 4, the electron beam evaporator 100 in accordance with any of examples 1 to 3 may optionally include the fact that the tubular target 102 has an internal diameter 203i that is greater than 2 cm. By way of example, the internal diameter 203i may be greater than 10 cm.

In example 5, the electron beam evaporator 100 in accordance with any of examples 1 to 4 may optionally include the fact that the tubular target 102 has a length 203h that is greater than 10 cm.

In example 6, the electron beam evaporator 100 in accordance with any of examples 1 to 5 may optionally include the fact that the tubular target 102 includes carbon or some other sublimating material. The tubular target 102 may for example substantially consist of carbon or graphite. The tubular target 102 may for example substantially consist of a sublimating material.

In example 7, the electron beam evaporator 100 in accordance with any of examples 1 to 6 may optionally furthermore include: a support arrangement 302 for rotatably mounting the tubular target 102. The support arrangement 302 may be configured for example such that the tubular target 102 may be rotated about the tube axis 102a thereof.

In example 8, the electron beam evaporator 100 in accordance with any of examples 1 to 7 may optionally furthermore include: a support arrangement 302, 402 for displaceably mounting the tubular target 102 along the tube axis 102a of the tubular target 102.

In example 9, the electron beam evaporator 100 in accordance with example 7 may optionally include the fact that the support arrangement 302, 402 is furthermore configured such that the tubular target 102 may be moved in an axial direction.

In example 10, the electron beam evaporator 100 in accordance with any of examples 1 to 9 may optionally furthermore include: a sensor 404 for detecting sensor data representing a spatial position of the removal surface 102f; an actuating apparatus 402 for moving 302a the tubular target 102 in an axial direction, and a regulator 406 configured, on the basis of the sensor data, by means of the actuating apparatus 402, to keep the position of the removal surface 102f fixed or to keep constant a distance of the removal surface 102f of the tubular target 102 relative to a substrate 320 to be coated.

In example 11, the electron beam evaporator 100 in accordance with any of examples 1 to 9 may optionally furthermore include: a diaphragm arrangement 408, which partly covers the removal surface 102f, wherein the diaphragm arrangement includes at least one diaphragm opening 408o in such a way that the electron beam 104e may be guided through the diaphragm opening 408o onto the removal surface 102f.

In example 12, the electron beam evaporator 100 in accordance with example 11 may optionally include the fact that the diaphragm arrangement 408 furthermore includes a cooling structure for cooling the diaphragm arrangement.

In example 13, the electron beam evaporator 100 in accordance with example 11 or 12 may optionally furthermore include: a distance sensor 404 for detecting sensor data representing a distance between the removal surface 102f of the tubular target 102 and the diaphragm arrangement 408; an actuating apparatus 402 for moving 302a the tubular target 102 in an axial direction, and a regulator 406 configured, on the basis of the sensor data, by means of the actuating apparatus 402, to keep constant the distance between the removal surface 102f and the diaphragm arrangement 408.

In accordance with various embodiments, it is possible to provide the actuating apparatus for actuating (illustratively for moving) the tubular target 102 and the support arrangement for mounting the tubular target 102 for a common positioning arrangement.

In example 14, the electron beam evaporator 100 in accordance with any of examples 1 to 13 may optionally furthermore include: a removal device configured to remove non-evaporated residues of evaporation material on the end side of the tubular target 102 in order to produce a planar removal surface 102f.

In example 15, the electron beam evaporator 100 in accordance with any of examples 1 to 13 may optionally furthermore include: a removal device configured to planarize, preferably mechanically planarize, the removal surface 102f. For this purpose, the removal device may be arranged for example between the diaphragm arrangement 408 and the removal surface 102f of the tubular target 102. Furthermore, the removal device may be mounted on the diaphragm arrangement 408. Furthermore, the removal device for mechanical planarization may have at least one cutting and/or grinding edge.

Example 16 is a coating apparatus 600, comprising: a coating chamber 602 having at least one coating region 602p; at least one electron beam evaporator 100 in accordance with any of examples 1 to 15 for coating a substrate 320 in the coating region 602p.

In example 17, the coating apparatus 600 in accordance with example 16 may optionally furthermore include: a transport apparatus 604 for transporting the substrate 320 in the coating region 602p along a transport direction 320t.

In example 18, the coating apparatus 600 in accordance with example 16 or 17 may optionally include the fact that the coating apparatus 600 includes a plurality of electron beam evaporators 100, wherein the respective tubular targets 102 of the plurality of electron beam evaporators 100 are arranged in a series along a direction at an angle or transversely with respect to the transport direction 320t.

In example 19, the coating apparatus 600 in accordance with any of examples 16 to 18 may optionally include the fact that the electron beam evaporator 100 includes a plurality of tubular targets 102 arranged in a series along a direction at angle or transversely with respect to the transport direction 320t.

In example 20, the coating apparatus 600 in accordance with example 18 or 19 may optionally include the fact that in each case two adjacent tubular targets 102 of the plurality of tubular targets 102 are configured such that they rotate in opposite rotation directions 302r, 502r.

Example 21 is an electron beam evaporator 100, comprising: a tubular target 102; an electron beam gun 104 for producing a vapor source 102q on a removal surface 102f of the tubular target 102 by means of an electron beam 104e; wherein the removal surface 102f of the tubular target 102 extends at an angle or transversely with respect to the tube axis 102a.

Example 22 is a coating method 700, comprising: producing at least one vapor source 102q on a removal surface 102f of a tubular target 102 by means of at least one electron beam 104e, wherein the removal surface 102f is a ring-shaped axial end surface or a surface of the tubular target 102 that extends conically or in a curved fashion from the free end edge; and coating a substrate 320 by means of the at least one vapor source 102q. In a similar manner, the coating method 700 may include the following: producing at least one vapor source 102q on a removal surface 102f of a tubular target 102 by means of at least one electron beam 104e, wherein the removal surface 102f of the tubular target 102 extends at an angle or transversely with respect to the tube axis 102a; and coating a substrate 320 by means of the at least one vapor source 102q.

In example 23, the coating method 700 in accordance with example 22 may optionally furthermore include: rotating 302r the tubular target 102 about the tube axis 102a thereof.

In example 24, the coating method 700 in accordance with example 22 or 23 may optionally furthermore include: moving 302a the tubular target 102 in the direction of the substrate 320 or a substrate plane 320e in which the substrate 320 is transported, in order to compensate for a material removal from the removal surface 102f.

In example 25, the coating method 700 in accordance with any of examples 22 to 24 may optionally furthermore include: producing an additional vapor source 102q on the removal surface 102f of the tubular target 102 by means of the at least one electron beam 104e.

In example 26, a tubular target 102 having a ring-shaped removal surface 102f is used for producing at least one vapor source 102q on the removal surface 102f by means of an electron beam.

In example 27, a tubular target 102 having a removal surface 102f extending conically or in a curved fashion from the free end edge 202r of the tubular target 102 is used for producing at least one vapor source 102q on the removal surface 102f by means of an electron beam.

Example 28 is an electron beam evaporator 100, comprising: a tubular target 102; an electron beam gun 104 for producing at least one vapor source 102q on a removal surface 102f of the tubular target 102 by means of an electron beam 104e; wherein the removal surface 102f is a surface of the tubular target 102 that extends in a ring-shaped fashion and that extends from an inner circumferential wall to an outer circumferential wall of the tubular target.

The invention claimed is:

1. An electron beam evaporator, comprising:
   a tubular target;
   an electron beam gun for producing at least one vapor source on a removal surface of the tubular target by means of an electron beam;
   wherein the removal surface is a surface of the tubular target that extends conically or in a curved fashion from the free end edge, wherein an angle between a surface normal of the removal surface and a tube axis of the tubular target is non-zero.

2. The electron beam evaporator as claimed in claim 1, wherein the angle between the tube axis and the surface normal of the removal surface is greater than 0° and less than or equal to 75°.

3. The electron beam evaporator as claimed in claim 1, furthermore comprising:
   a support arrangement for rotatably mounting the tubular target in such a way that the tubular target can be rotated about the tube axis thereof,
   wherein the support arrangement is furthermore configured in such a way that the tubular target can be moved along the tube axis thereof.

4. The electron beam evaporator of claim 1, furthermore comprising:
   a sensor for detecting sensor data representing a spatial position of the removal surface;
   an actuating apparatus for moving the tubular target along the tube axis thereof, and
   a regulator configured, on the basis of the sensor data, by means of the actuating apparatus, to keep the position of the removal surface fixed or to keep constant a distance of the removal surface relative to a substrate to be coated.

5. The electron beam evaporator of claim 1, furthermore comprising:
   a diaphragm arrangement, which partly covers the removal surface, wherein the diaphragm arrangement comprises at least one diaphragm opening in such a way that the electron beam can be guided through the diaphragm opening onto the removal surface of the tubular target.

6. The electron beam evaporator as claimed in claim 5, wherein the diaphragm arrangement furthermore comprises a cooling structure for cooling the diaphragm arrangement.

7. The electron beam evaporator as claimed in claim 5, furthermore comprising:
   a distance sensor for detecting sensor data representing a distance between the removal surface of the tubular target and the diaphragm arrangement;
   an actuating apparatus for moving the tubular target in an axial direction, and
   a regulator configured, on the basis of the sensor data, by means of the actuating apparatus, to keep constant the distance between the removal surface and the diaphragm arrangement.

8. The electron beam evaporator of claim 1, furthermore comprising:
   a removal device configured to planarize the removal surface.

9. A coating apparatus, comprising:
   a coating chamber having at least one coating region;
   at least one electron beam evaporator for coating a substrate in the coating region, the electron beam evaporator comprising:
   a tubular target;
   an electron beam gun for producing at least one vapor source on a removal surface of the tubular target by means of an electron beam;
   wherein the removal surface is a surface of the tubular target that extends conically or in a curved fashion from the free end edge, wherein an angle between a surface normal of the removal surface and a tube axis of the tubular target is non-zero.

10. The electron beam evaporator as claimed in claim 9, wherein the angle between the tube axis and the surface normal of the removal surface is greater than 0° and less than or equal to 75°.

11. The electron beam evaporator as claimed in claim 9, furthermore comprising:
    a support arrangement for rotatably mounting the tubular target in such a way that the tubular target can be rotated about the tube axis thereof,
    wherein the support arrangement is furthermore configured in such a way that the tubular target can be moved along the tube axis thereof.

12. The electron beam evaporator of claim 9, furthermore comprising:
    a sensor for detecting sensor data representing a spatial position of the removal surface;
    an actuating apparatus for moving the tubular target along the tube axis thereof, and
    a regulator configured, on the basis of the sensor data, by means of the actuating apparatus, to keep the position of the removal surface fixed or to keep constant a distance of the removal surface relative to a substrate to be coated.

13. The electron beam evaporator of claim 9, furthermore comprising:
    a diaphragm arrangement, which partly covers the removal surface, wherein the diaphragm arrangement comprises at least one diaphragm opening in such a way that the electron beam can be guided through the diaphragm opening onto the removal surface of the tubular target.

14. The electron beam evaporator as claimed in claim 13, wherein the diaphragm arrangement furthermore comprises a cooling structure for cooling the diaphragm arrangement.

15. The electron beam evaporator as claimed in claim 13, furthermore comprising:
    a distance sensor for detecting sensor data representing a distance between the removal surface of the tubular target and the diaphragm arrangement;
    an actuating apparatus for moving the tubular target in an axial direction, and a regulator configured, on the basis of the sensor data, by means of the actuating apparatus, to keep constant the distance between the removal surface and the diaphragm arrangement.

16. The electron beam evaporator of claim 9, furthermore comprising:
a removal device comprising a cutting and/or grinding edge configured to mechanically planarize the removal surface.

17. A coating method, comprising:
producing at least one vapor source on a removal surface of a tubular target by means of at least one electron beam,
wherein the removal surface is a surface of the tubular target that extends conically or in a curved fashion from the free end edge, wherein an angle between a surface normal of the removal surface and a tube axis of the tubular target is non-zero, and
coating a substrate by means of the at least one vapor source.

18. The electron beam evaporator of claim 1, wherein the tubular target substantially consists of graphite.

19. The electron beam evaporator of claim 8, wherein the removal device comprises a cutting and/or grinding edge for mechanically planarizing the removal surface.

20. The electron beam evaporator of claim 11, wherein the support arrangement is further configured to rotate the tubular target about the tube axis independent from movement of the tubular target along the tube axis.

* * * * *